United States Patent [19]

Fillion et al.

[11] Patent Number: 5,315,486
[45] Date of Patent: May 24, 1994

[54] HERMETICALLY PACKAGED HDI ELECTRONIC SYSTEM

[75] Inventors: Raymond A. Fillion, Niskayuna; William P. Kornrumpf, Albany; Edward S. Bernard, Manlius, all of N.Y.

[73] Assignee: General Electric Company, Schenectady, N.Y.

[21] Appl. No.: 73,250

[22] Filed: Jun. 7, 1993

Related U.S. Application Data

[63] Continuation of Ser. No. 807,325, Dec. 16, 1991.

[51] Int. Cl.⁵ .................. H01L 23/053; H01L 23/055; H01L 23/10; H05K 1/16
[52] U.S. Cl. .................. 361/795; 174/253; 174/255; 174/260; 174/261; 174/52.4; 257/676; 257/688; 257/700; 257/723; 257/724; 257/684; 361/760; 361/761; 361/762; 361/772; 361/774; 361/792; 361/793; 361/794; 361/807; 361/809; 361/813
[58] Field of Search .............. 257/668, 684, 700, 723, 257/724, 758, 759, 760, 782, 676, 688; 361/760, 761, 762, 763, 764, 792, 793, 794, 772, 774, 807, 809, 813; 437/206, 207, 217, 220; 439/70; 174/52.4, 253, 255, 260, 261

[56] References Cited

U.S. PATENT DOCUMENTS

| | | | |
|---|---|---|---|
| 3,614,832 | 10/1971 | Chance et al. | 361/414 |
| 4,630,096 | 12/1986 | Drye et al. | 361/761 |
| 4,633,573 | 1/1987 | Scherer | 174/52.4 |
| 4,751,482 | 6/1988 | Fukuta et al. | 333/247 |
| 4,814,943 | 3/1989 | Okuaki | 361/760 |
| 4,835,847 | 6/1989 | Kamperman | 29/840 |
| 4,861,641 | 8/1989 | Foster et al. | 428/901 |
| 4,870,224 | 9/1989 | Smith et al. | 174/52.4 |
| 4,901,136 | 2/1990 | Neugebauer et al. | 257/724 |
| 5,049,978 | 9/1991 | Bates et al. | 357/75 |
| 5,138,436 | 8/1992 | Koepf | 257/668 |

FOREIGN PATENT DOCUMENTS

| | | | |
|---|---|---|---|
| 0092944 | 11/1983 | European Pat. Off. | |
| 0101791 | 3/1984 | European Pat. Off. | 361/414 |
| 0183598 | 6/1986 | European Pat. Off. | |
| 0257119 | 3/1988 | European Pat. Off. | |
| 0266210 | 5/1988 | European Pat. Off. | |
| 0344702 | 12/1989 | European Pat. Off. | 357/80 |
| 0435530 | 7/1991 | European Pat. Off. | |
| 0045940 | 3/1982 | Japan | 357/70 |
| 61-7656 | 1/1986 | Japan | 257/778 |
| 61-7657 | 1/1986 | Japan | 257/778 |
| 0029138 | 2/1986 | Japan | 357/70 |
| 61-47659 | 3/1986 | Japan | 257/778 |
| 0225829 | 10/1986 | Japan | 357/80 |
| 0024634 | 2/1987 | Japan | 228/180.2 |
| 0213144 | 9/1987 | Japan | 357/74 |
| 92/16091 | 9/1992 | PCT Int'l Appl. | |

OTHER PUBLICATIONS

IBM Disclosure Bulletin "Low-Temperature Alloy Seal For Electronic Modules" by D. G. Pittwood vol. 19 No. 8 Jan. 1977.

*Primary Examiner*—Leo P. Picard
*Assistant Examiner*—Donald A. Sparks
*Attorney, Agent, or Firm*—Geoffrey H. Krauss

[57] ABSTRACT

A hermetic package particularly adapted for high density interconnect (HDI) electronic systems employs a ceramic substrate which serves as a base for the hermetic package. The substrate comprises a cofired body including buried conductors which provide electrical continuity between a set of inner contact points and a set of outer contact points bridging a seal ring that comprises either a solder seal or a weldable seal for the hermetic package lid. The outer contact points may be directly connected to a leadframe. The leadframe leads, after severing, can be directly attached to a printed circuit board.

21 Claims, 5 Drawing Sheets

HERMETICALLY PACKAGED HDI ELECTRONIC SYSTEM

This application is a continuation of application Ser. No. 07/807,325 filed Dec. 16, 1991.

BACKGROUND OF THE INVENTION

The present invention relates generally to integrated circuit packaging and, more particularly, to hermetically packaged electronic systems embodying a high density interconnect (HDI) structure.

Hermetically sealed packages have long been used to package semiconductor devices for use in high reliability systems and in hostile environments. A primary advantage of a hermetically sealed package for a sensitive electronic device or circuit is that the hermetic seal ensures that no outside contaminants or other deleterious materials can reach the sensitive device, component or circuit. This ensures that a device which, after hermetic sealing, meets specifications during testing, will not deteriorate as a result of contamination or the introduction of other deleterious materials. This assurance is particularly important in systems which must exhibit high reliability.

While production of a container for an electronic circuit which can be hermetically sealed does not seem, at first glance, to be a particularly complicated process, this initial perception can be misleading, especially when a new container configuration is required. Lead time for fabrication of a new container configuration normally runs at least 4–6 months and often more. If changes are required, the same period of time is needed for revisions. Consequently, when a new system is designed, it must either be designed to fit into an existing hermetic enclosure or substantial lead time must be provided for designing and fabricating the hermetic enclosure for that system.

As disclosed in Eichelberger et al. U.S. Pat. No. 4,783,695, and related patents, a high density interconnect (HDI) structure which has been developed by General Electric Company offers many advantages in the compact assembly of digital and other electronic systems. For example, an electronic system such as a microcomputer which incorporates between thirty and fifty integrated circuit chips, or even more, can be fully assembled and interconnected on a single HDI substrate which is fifty mm long, fifty mm wide and 1.27 mm thick.

This HDI structure can be disassembled for repair or replacement of a faulty component and then reassembled without significant risk to the good components incorporated within the system. Repairability is particularly important where fifty or more chips having a cost of as much as $2,000.00, each, may be incorporated in a single system on one substrate. This repairability is a substantial advance over prior interconnection systems in which reworking the system to replace damaged (i.e., faulty) components is either impossible or involves substantial risk to the undamaged (i.e., good) components. Exemplary testing and repair techniques are disclosed in Eichelberger et al. Pat. Nos. 4,878,991, 4,884,122 and 4,937,203.

Very briefly, in the manufacture of one embodiment of systems employing the aforementioned HDI structure, individual cavities (or one large cavity) having appropriate depths at the intended locations of the various chips are formed in a component-supporting surface of the ceramic substrate. The various integrated circuit chips and other components are placed in their desired locations within the cavities and adhesively attached to the substrate.

At this stage, the upper surfaces of all components and portions of the substrate component-supporting surface are disposed substantially in a common plane. A multi-layer high density interconnect (HDI) overcoat structure including interleaved layers of dielectric material and metallized conductive material is then built up to electrically interconnect the components into a functioning system.

The HDI overcoat structure typically does not extend all the way to the outer edge of the substrate component-supporting surface; rather, the overcoat structure terminates just inside a row of contact pads to which external connections are subsequently made, such as by ultrasonic wire bonding, when the system is finally assembled into a suitable leaded package. These contact pads are formed directly on portions of the substrate surface surrounding the cavities, and are electrically connected through suitable vias within the HDI overcoat structure to lower metallization layers of the HDI overcoat structure. Metallization deposited or otherwise formed directly on the ceramic substrate, as opposed to metallization layers within the HDI overcoat structure, is referred to as "metal zero".

This connection of the HDI electronic system into a separate leaded package, such as by conventional wire bonding, creates an additional interface, increases thermal impedance, and ultimately results in higher assembly costs than is achieved in accordance with the present invention.

SUMMARY OF THE INVENTION

Accordingly, one object of the invention is to provide a packaged electronic system of improved performance and reliability by eliminating a package interface and need for wire bond interconnection.

Another object of the invention is to provide a simplified hermetic HDI system packaging configuration which does not require custom designing and is compatible with existing HDI system manufacturing processes.

Another object of the invention is to provide a hermetic package which can be readily disassembled to repair an electronic system contained therein, and which can subsequently be resealed.

Another object of the invention is to provide an HDI system assembly which eliminates the need for packaging an HDI substrate in a secondary package and allows both size and weight reduction.

Briefly, in accordance with a preferred embodiment of the invention, a packaged electronic system includes a package base comprising a ceramic substrate having a component supporting surface. At least one electronic component having contact pads is disposed on the component-supporting surface. The component-supporting surface preferably includes at least one cavity within which the electronic components are disposed, so as to ensure that major surfaces of the electronic components are substantially coplanar with portions of the component-supporting surface surrounding the cavity or cavities.

A seal ring is disposed on the component-supporting surface encircling the electronic components and any cavities in which they are situated. The seal ring may comprise either a solder seal ring or a weldable ring.

Disposed on the component-supporting surface just inside the seal ring is a set of inner contact points, comprising, for example, contact pads. Disposed on the supporting surface just outside the seal ring is a corresponding set of outer contact points, also comprising contact pads. The outer contact points are adapted for connection to individual leads of a lead frame.

To provide electrical continuity, a set of electrical conductors extends between the inner and outer sets of contact points and is buried, at least in part, in the ceramic substrate. The ceramic substrate and the set of electrical conductors buried, at least in part, in the ceramic substrate comprise a cofired body.

Electrical connections are made between the component contact pads and the inner contact points, preferably by means of a multilayer HDI overcoat structure including interleaved layers of dielectric material and conductive material disposed over portions of the substrate, over the electronic components, and over the set of inner contact points.

To complete the hermetic structure, a package lid is attached to the solder seal ring enclosing the electronic components and the HDI overcoat structure.

Preferably, to provide for convenient grounding of the package lid, an electrical feedthrough extends from the seal ring through the ceramic substrate to an opposite side of the ceramic substrate. In this instance, the electrical feedthrough for grounding also comprises a portion of the cofired body.

In embodiments where the seal ring comprises a solder ring on portions of the component-supporting surface surrounding any cavities, the seal ring, upper surfaces of the components, and substantially all portions of the component-supporting surface surrounding the cavities are coplanar.

In embodiments where the seal ring comprises a weldable ring, the component-supporting surface includes a peripheral ledge having a ledge surface recessed with respect to the portion of the component-supporting surface surrounding the cavity. The weldable ring has a thickness such that a major surface of the weldable ring is substantially coplanar with portions of the component-supporting surface surrounding the cavity. The weldable ring results in an easily repairable package.

The invention thus results in a hermetic package particularly adapted for HDI electronic systems. The ceramic base of the package, which also constitutes the HDI substrate, comprises a cofired and highly hermetic body including buried conductors which provide electrical continuity between the inner and outer contact points that bridge the seal ring for the hermetic package lid. The outer contact points are adapted for connection to leads of a conventional leadframe such that, after severing, the leadframe leads and thus the package can be directly attached to a printed circuit board.

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings, in which:

DETAILED DESCRIPTION

Figure 1:
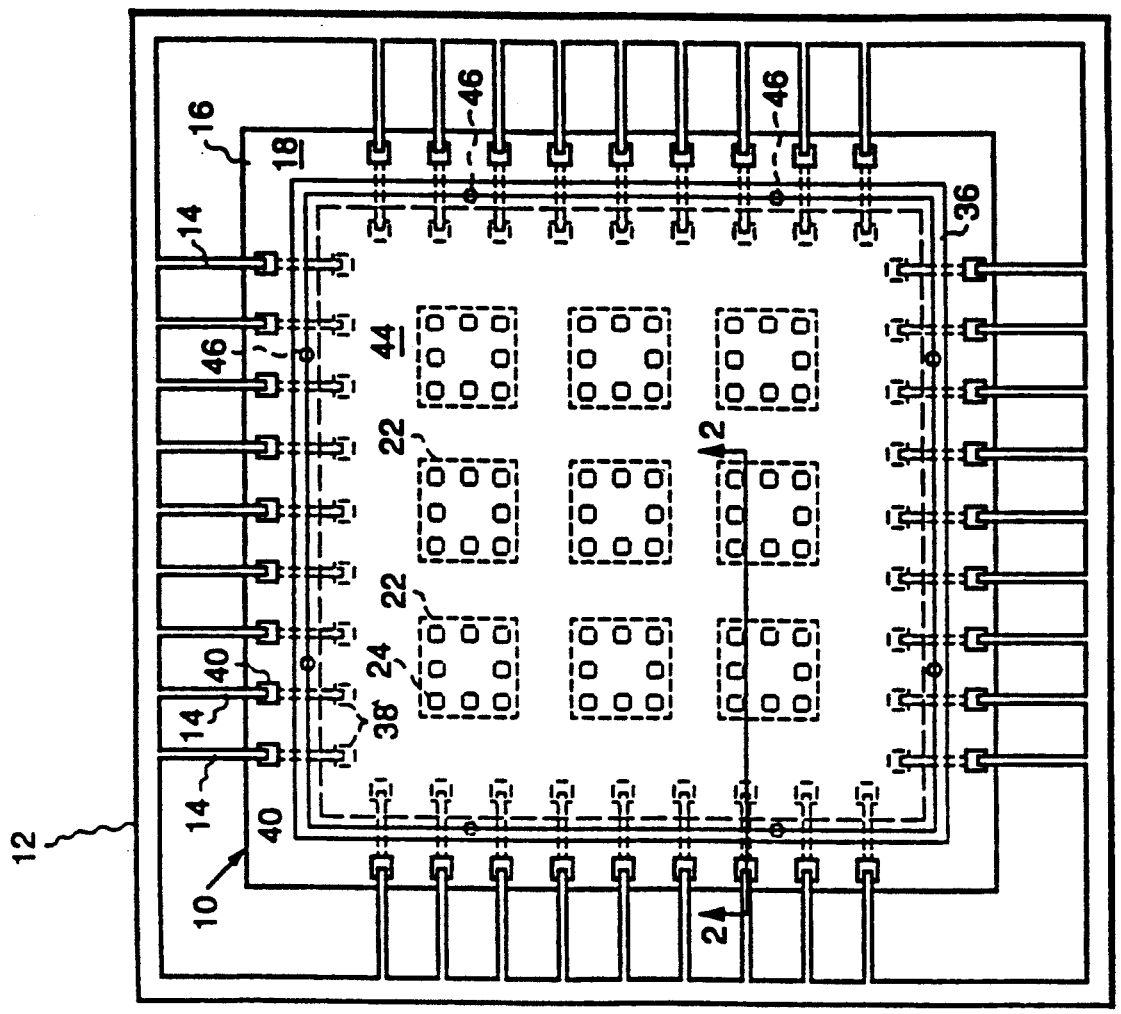
FIG. 1 is a plan view of a packaged electronic system in accordance with the invention, shown connected to a lead frame.

FIG. 1 shows, in plan view, a packaged electronic system 10 in accordance with the invention attached to a conventional lead frame 12 having individual leads 14. It will be appreciated that, prior to actual mounting of the packaged electronic system on a printed circuit board, for example, lead frame 12 is severed from individual leads 14.

Figure 2:
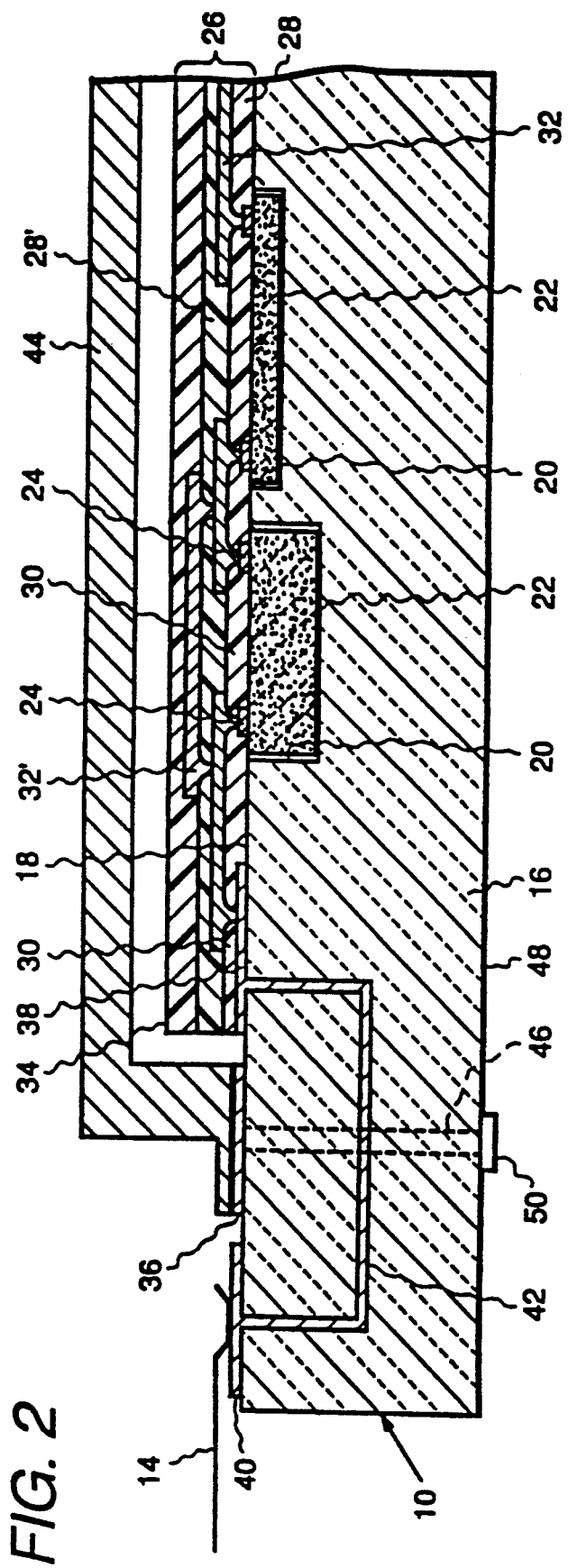
FIG. 2 is a cross section view taken along line 2—2 of FIG. 1, showing details of an embodiment of the invention employing a solder seal ring.

With reference to FIG. 2 in addition to FIG. 1, the packaged electronic system is seen to include a ceramic substrate 16, which, in accordance with the invention, also serves as the base of the completed hermetic package. The ceramic substrate material may comprise either alumina ($Al_2O_3$) or aluminum nitride (AlN). In accordance with HDI fabrication processes, substrate 16 may, for example, have a thickness between 0.635 and 2.54 mm (25 and 100 mils). The is of appropriate size and strength for the overall system, and is typically less than fifty mm square.

Upper surface 18 of substrate 16 is a component-supporting surface. Included in component-supporting surface 18 are either one large cavity (not shown) or individual cavities 20 within which integrated circuit chips 22 having contact pads 24 are placed. The individual cavities 20 are of appropriate depths for the various chips 22 mounted therein.

Cavities 20 may be formed by starting with a bare substrate having a uniform thickness and desired size. Conventional, laser or ultrasonic milling is used to form cavities 20 in which the various chips and other components are to be positioned. Where a relatively thicker or relatively thinner component will be placed, the corresponding cavity bottom is made respectively deeper or shallower.

The cavity 20 bottoms are then each provided with a thermoplastic adhesive layer (not shown), preferably polyetherimide resin available under the trademark ULTEM ® from General Electric Company, Pittsfield, Mass. The various chips and components are then placed in their desired locations within cavities 20, and the entire structure is heated to the softening point of the polyetherimide (in the vicinity of 217° C. to 235° C. depending on the formulation used), and then cooled to thermoplastically bond the individual IC chips 22 to cavities 20.

At this stage, the upper surfaces of all components 22 and the unmilled portions of the substrate component-supporting surface 18 surrounding cavities 20 are disposed in substantially a common plane. A multi-layer high density interconnect (HDI) overcoat structure 26 is then built up to electrically interconnect the components into an actual functioning system. To begin the HDI overcoat structure, a polyimide dielectric film 28, which may be Kapton ® polyimide available from E. I. du Pont de Nemours and Company, Wilmington, Del., about 0.0005 to 0.003 inch (12.5 to 75 microns) thick is pretreated to promote adhesion. The Kapton polyimide is coated on one side with ULTEM ® polyetherimide resin or some other appropriate thermoplastic and laminated across the top of chips 22, other components, and the substrate component-supporting surface 18. The ULTEM resin serves as a thermoplastic adhesive to hold the Kapton polyimide film 28 in place.

Next, via holes 30 are laser-drilled in the Kapton film and ULTEM adhesive layers thereon, in alignment with contact pads 24 on electronic components 22 to which it is desired to make contact. Exemplary laser drilling techniques are disclosed in Eichelberger et al. Pat. Nos. 4,714,516 and 4,894,115; and in Loughran et al. Pat. No. 4,764,485, each of which is incorporated herein by reference.

Build up of the HDI structure continues by forming a patterned metallization layer 32 over Kapton film layer 28 and extending into via holes 30 to make electrical contact to contact pads 24 at the bottoms of the holes. Metallization layer 32 may be patterned to form individual conductors while it is being applied over Kapton film layer 28, or it may be applied as a continuous layer and then patterned using photoresist and etching techniques. The photoresist is preferably exposed using a laser which is scanned relative to the substrate to provide an accurately aligned conductor pattern at the end of the process. Exemplary techniques for patterning the metallization layer 32 are disclosed in Wojnarowski et al. U.S. Pat. Nos. 4,780,177 and 4,842,677; in Eichelberger et al. Pat. No. 4,835,704, each of which is incorporated herein by reference. Any misposition of the individual chips 22 and their contact pads 24 is compensated for by an adaptive laser lithography system as disclosed in Eichelberger et al. U.S. Pat. No. 4,835,704.

Additional dielectric 28' and metallization 32' layers are provided as required in order to provide all of the desired electrical connections among chips 22. The HDI overcoat layer 26 terminates at an edge 34, and does not extend all the way to the edge of substrate 16.

A seal ring 36, disposed on component-supporting surface 18 of substrate 16, encircles cavities 20 and components 22. In the embodiment shown in FIG. 2, seal ring 36 is a solder seal ring comprising metal, such as tungsten, preferably cofired with ceramic substrate 16 as described in greater detail hereinbelow with reference to FIG. 3. Alternatively, solder seal ring 36 may be a layered structure, comprising layers of titanium-copper-nickel, respectively, or titanium-gold, respectively.

Also disposed on the component-supporting surface inside seal ring 36 is a set of inner contact points 38, comprising pads for example. Correspondingly located on the component-supporting surface outside seal ring 36 is a set of outer contact points 40, also comprising pads. Outer contact points 40 are adapted for connection to leads 14 of lead frame 12 (FIG. 1). Pads 40 may comprise gold, aluminum, copper, or another suitable metal, such as tungsten, cofired with ceramic substrate 16 as described in greater detail hereinbelow with reference to FIG. 3. The individual leads 14 of lead frame 12 may be attached to outer contact pads 40 by either welding or soldering.

To provide electrical continuity between inner contact points 38 and outer contact points 40, a set of electrical conductors 42 is, at least in part, buried in ceramic substrate 16, and cofired therewith, again as described in greater detail hereinbelow with reference to FIG. 3.

To complete the hermetically sealed structure, a package lid 44 is attached to seal ring 36, enclosing electronic components 22 and HDI overcoat structure 26. Thus, HDI overcoat structure 26 which terminates at edge 34 is wholly within the enclosure comprising package lid 44, but extends far enough to make electrical contact with the set of inner contact points 38. The package lid may comprise Kovar ® metal, which is a steel alloy having a thermal coefficient of expansion very close to that of ceramic, or other suitable material. In the embodiment of FIG. 2 wherein seal ring 36 is a solder seal ring, lid 44 is simply soldered to ring 36 following initial testing of the system. In the completed package structure, it is thus apparent that ceramic substrate 16 serves both as an HDI substrate and as a package base.

Preferably, to facilitate electrical grounding of package lid 44, at least one electrical feedthrough 46 extends from seal ring 36 at upper surface 18 of ceramic substrate 16 through the ceramic substrate to an opposite (i.e., lower) surface 48 thereof. Electrical feedthrough 46 terminates at a representative contact pad 50, or other suitable electrical connection structure.

Figure 3:
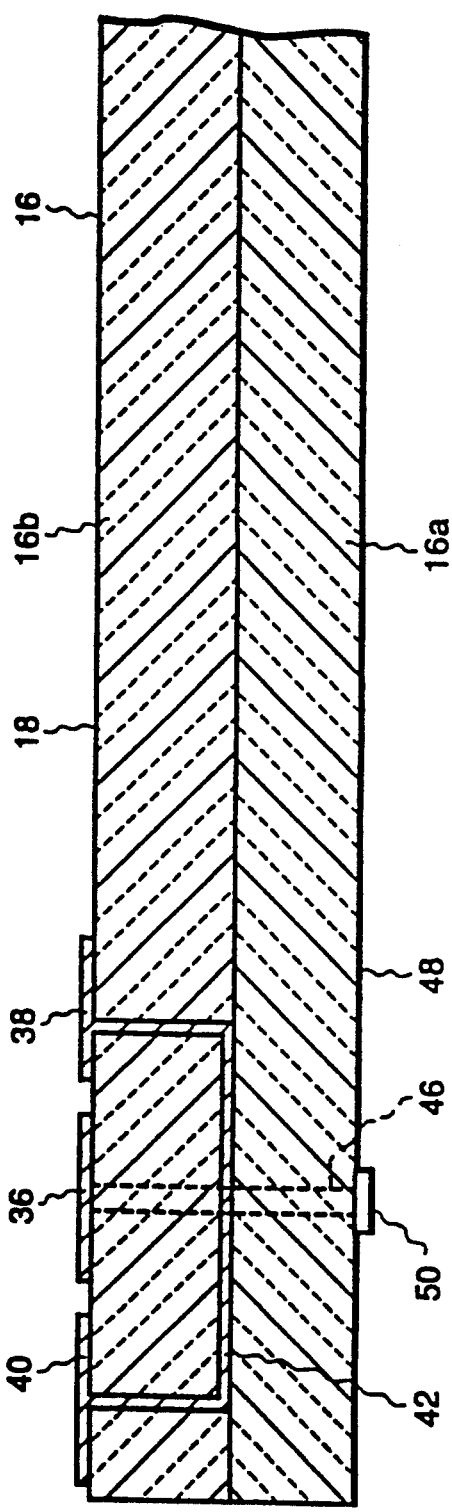
FIG. 3 is a cross section view corresponding to that of FIG. 2, depicting an intermediate fabrication step prior to firing of the cofired body comprising the ceramic HDI substrate and package base.

FIG. 3 depicts an intermediate step in a fabrication process whereby ceramic substrate 16, buried electrical conductors 42 and electrical feedthrough 46 comprise a cofired body, which also includes solder seal 36, inner contact pads 38 and outer contact pads 40. An essentially conventional multilayer ceramic fabrication process is employed. What is known as "green" (unfired) ceramic tape is used. Green ceramic tape is somewhat like cardboard, and includes various plasticizers and binders. The final ceramic substrate 16 of FIG. 2 is depicted in FIG. 3 as comprising two discrete layers 16a and 16b of green ceramic tape. After firing, layers 16a and 16b comprise a uniform and hermetic body (i.e., substrate) which no longer has a laminated structure. Such monolithic structure is fabricated on a layer-by-layer basis. Starting with layer 16a, necessary holes for vias and for registration purposes are punched. Conductor material is then screen printed onto layer 16a, preferably under vacuum conditions, such that the vias are completely filled and buried connection 42 is formed. In order to withstand subsequent high temperature processing, for example 1600° C., a metal such as tungsten is employed as the conductor material.

As many layers as are needed are subsequently built up, continuing, for example, with layer 16b on which pads 38 and 40 are printed, as well as ring 36. The structure is then placed in a sintering oven, which employs a controlled atmosphere and temperature to form the final structure in a series of stages over time. An initial stage, at a relatively lower temperature, is a binder burnout stage, which results in a relatively porous ceramic. The temperature is then increased to ultimately create a dense ceramic and thus a highly hermetic cofired body including the ceramic and metallization layers. However, ceramic materials are available which are fired at lower temperatures, for example 900° C. At such lower temperatures, silver or copper may be employed for the conductors, rather than tungsten. The result of firing at lower temperatures may be referred to as a low temperature cofired body.

The detailed design and fabrication of multilayer cofired ceramic bodies of the type described, whether cofired at the high or low temperatures, is a time-consuming process. Nevertheless, the cofired body comprising ceramic substrate 16, buried electrical conductors 42, and feedthrough conductors 46 need not be customized for the particular system being manufactured. The sets of inner contact points 38 and outer contact points 40 are arranged for general purpose, and the specific circuit configuration is determined by the subsequently-applied HDI overcoat structure 26 and milled cavities 20 which may readily be fabricated on a custom basis in accordance with the HDI fabrication process disclosed in detail in the various patents referred to hereinabove.

Figure 4:
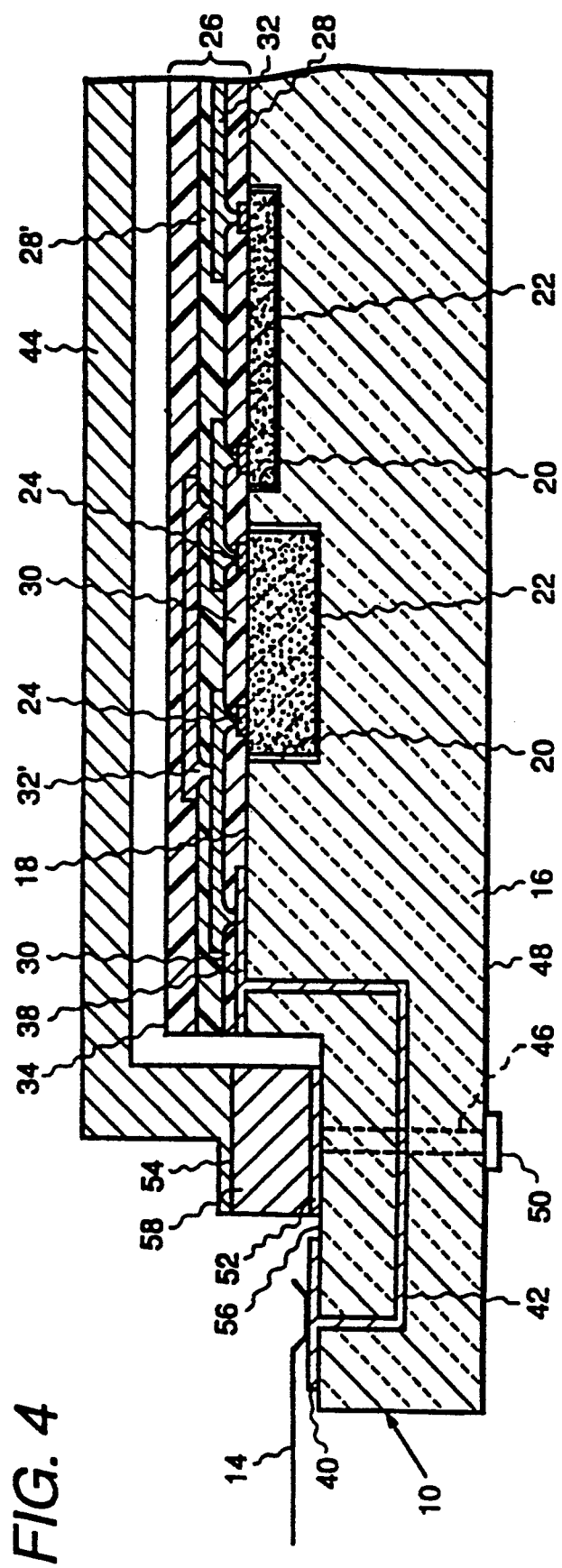
FIG. 4 is a cross section view generally comparable to that of FIG. 2, but depicting an embodiment of the invention employing a weldable seal ring.

FIG. 4 illustrates an alternative embodiment of the invention which, rather than the solder seal ring 36 of the embodiment shown in FIG. 2, employs a weldable ring 58 for attachment of hermetic lid 44. Weldable ring 58 is preferably made of Kovar metal, although molybdenum may alternatively be employed. Weldable ring 58 is attached such as by brazing to a ring 52 of metal cofired with the ceramic base. Lid 44 is attached to ring 58 by parallel seam electrical resistance welding, for example.

An advantage of the weldable ring embodiment of FIG. 4 is that the system may be more readily reworked, even after attachment of the hermetic package lid. In particular, lid 44 can be carefully ground off, while still leaving a substantial portion of weldable ring 58 for subsequent attachment of a new lid. This is an important aspect where extremely expensive chips may be employed in an HDI system, and repairability is a viable and significant aspect.

Preferably, a major or top surface 54 of weldable ring 58 is substantially coplanar with portions of component-supporting substrate surface 18 surrounding cavities 22. To this end, component-supporting surface 18 includes a peripheral ledge having a ledge surface 56 recessed with respect to portions of the component-supporting surface surrounding the cavities by an amount that positions weldable ring 58 at the proper height with respect to substrate surface 18.

Figure 5:
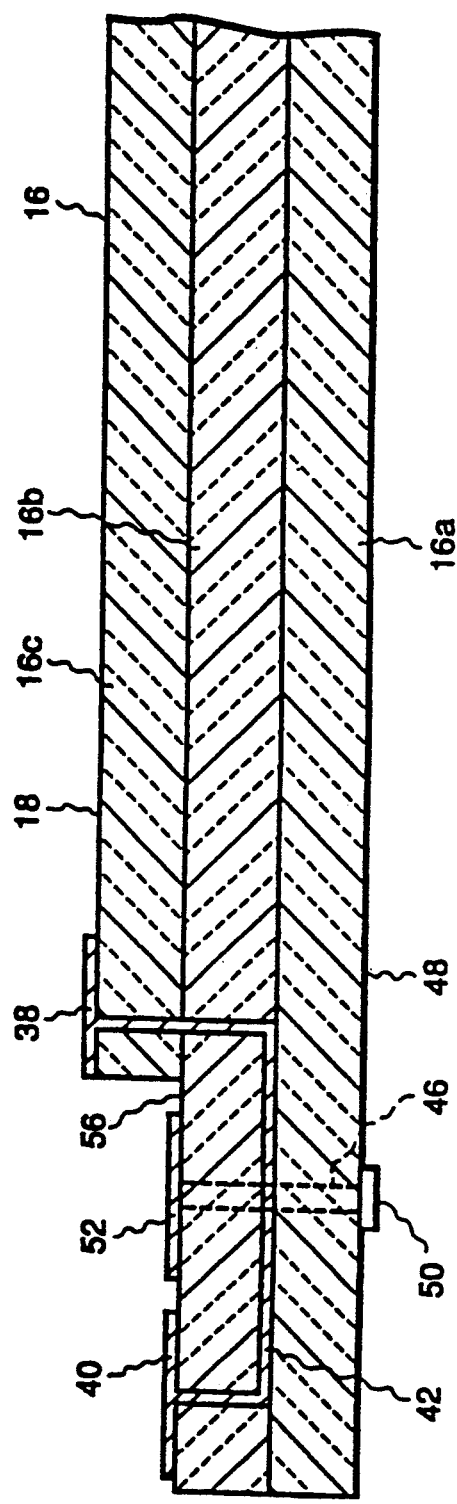
FIG. 5 is a cross section view corresponding to that of FIG. 4, depicting an intermediate step in the fabrication process prior to firing of the cofired ceramic body comprising the ceramic HDI substrate and package base.

FIG. 5 depicts an intermediate stage in the fabrication process, prior to firing, when the ultimate ceramic substrate 16 of the embodiment shown in FIG. 4 comprises three layers 16a, 16b and 16c of green ceramic tape. This structure is fabricated in a manner similar to that described for the structure shown in FIG. 3.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A packaged electronic system comprising:
   a ceramic substrate having a component-supporting surface, and at least one electronic component disposed on said component-supporting surface, said component having contact pads thereon;
   a seal ring disposed on said component-supporting surface encircling said at least one electronic component;
   a set of inner contact points on said component-supporting surface located inside said seal ring, and a corresponding set of outer contact points on said component-supporting surface located outside said seal ring;
   a set of electrical conductors at least in part buried in said ceramic substrate and extending between said inner and outer sets of contact points;
   electrical connections between at least some of said components contact pads and said inner contact points, comprising a multilayer interconnect structure including interleaved layers of dielectric material and conductive material disposed over portions of said substrate, over said at least one electronic component and over said inner set of contact points; and
   a package lid attached to said seal ring and enclosing said at least one electronic component and said electrical connections.

2. The packaged electronic system in accordance with claim 1, wherein said ceramic substrate and said set of electrical conductors buried at least in part in said ceramic substrate comprise a cofired body.

3. The packaged electronic system in accordance with claim 1, wherein said component-supporting surface includes at least one cavity, said electronic component being disposed in said cavity such that a major surface of said electronic component is substantially coplanar with a portion of said component-supporting surface surrounding said cavity.

4. The packaged electronic system in accordance with claim 1 and further including a lead frame, at least some of said outer contact points being connected to corresponding individual leads of said lead frame.

5. A packaged electronic system comprising:
   a ceramic substrate having a component-supporting surface, and at least one electronic component disposed on said component-supporting surface, said component having contact pads thereon;
   a seal ring disposed on said component-supporting surface encircling said at least one electronic component;
   a set of inner contact points on said component-supporting surface located inside said seal ring, and a corresponding set of outer contact points on said component-supporting surface located outside said seal ring;
   a set of electrical conductors at least in part buried in said ceramic substrate and extending between said inner and outer sets of contact points;
   electrical connections between at least some of said component contact pads and said inner contact points;
   a package lid attached to said seal ring and enclosing said at least one electronic component and said electrical connections; and
   an electrical feedthrough extending from said seal ring through said ceramic substrate to an opposite surface thereof, whereby said seal ring and said package lid may be grounded through said electrical feedthrough.

6. The packaged electronic system in accordance with claim 5, wherein said ceramic substrate, said set of electrical conductors buried at least in part in said ceramic substrate and said electrical feedthrough comprise a cofired body.

7. A packaged electronic system in accordance with claim 5, wherein said ceramic substrate and said set of electrical conductors at least in part buried in said ceramic substrate comprise a cofired body.

8. A packaged electronic system in accordance with claim 5, wherein said outer contact points are adapted for connection to individual leads of a lead frame.

9. A packaged electronic system comprising:
- a ceramic substrate having a component-supporting surface which includes at least one cavity, and a plurality of electronic components, each of said components having contact pads thereon, disposed within said at least one cavity on said component-supporting surface such that major surfaces of said components are substantially coplanar with portions of said component-supporting surface surrounding said at least one cavity;
- a seal ring disposed on said component-supporting surface encircling said at least one electronic component;
- a set of inner contact points on said component-supporting surface located inside said seal ring, and a corresponding set of outer contact points on said component-supporting surface located outside said seal ring;
- a set of electrical conductors at least in part buried in said ceramic substrate and extending between said inner and outer sets of contact points;
- electrical connections between at least some of said component contact pads and said inner contact points; and
- a package lid attached to said seal ring and enclosing said at least one electronic component and said electrical connections.

10. The packaged electronic system in accordance with claim 9, wherein said electrical connections extending between at least some of said component contact pads and at least some of said inner contact points, respectively, comprise a multilayer interconnect structure including interleaved layers of dielectric material and conductive material, said multilayer interconnect structure being disposed over said portion of said component-supporting surface surrounding said cavity, over said electronic components and over said inner set of contact points.

11. A packaged electronic system in accordance with claim 9, wherein said ceramic substrate and said set of electrical conductors at least in part buried in said ceramic substrate comprise a cofired body.

12. A packaged electronic system in accordance with claim 9, wherein said outer contact points are adapted for connection to individual leads of a lead frame.

13. A packaged electronic system comprising:
- a ceramic substrate having a component-supporting surface including at least one cavity, and at least one electronic component, having contact pads thereon, and disposed within said at least one cavity such that a major surface of said at least one electronic component is substantially coplanar with portions of said component-supporting surface surrounding said at least one cavity;
- a solder seal ring on said portions of said component-supporting surface surrounding said at least one cavity;
- a set of inner contact points on said component-supporting surface located inside said seal ring, and a corresponding set of outer contact points on said component-supporting surface located outside said seal ring;
- a set of electrical conductors at least in part buried in said ceramic substrate and extending between said inner and outer sets of contact points;
- electrical connections between at least some of said component contact pads and said inner contact points; and
- a package lid attached to said seal ring and enclosing said at least one electronic component and said electrical connections.

14. A packaged electronic system in accordance with claim 13, wherein said ceramic substrate and said set of electrical conductors at least in part buried in said ceramic substrate comprise a cofired body.

15. A packaged electronic system in accordance with claim 13, wherein said outer contact points are adapted for connection to individual leads of a lead frame.

16. A packaged electronic system comprising:
- a ceramic substrate having a component-supporting surface including at least one cavity;
- at least one electronic component having contact pads therein and disposed in said cavity such that a major surface of said electronic component is substantially coplanar with a portion of said component-supporting surface surrounding said cavity;
- said component-supporting surface including a peripheral ledge having a ledge surface recessed with respect to said portion of said component-supporting surface surrounding said cavity;
- a seal ring comprising a weldable ring disposed on said ledge surface encircling said at least one electronic component, said weldable ring having a thickness such that a major surface thereof is substantially coplanar with said portion of said component-supporting surface surrounding said cavity;
- a set of inner contact points on said component-supporting surface and a corresponding set of outer contact points on said component-supporting surface, said inner contact points being encircled by said seal ring and said outer contact points being situated outside said seal ring;
- a set of electrical conductors buried at least in part in said ceramic substrate and extending between said inner and outer sets of contact points;
- electrical connections extending between at least some of said component contact pads and at least some of said inner contact points, respectively; and
- package lid attached to said seal ring and enclosing said electronic component and said electrical connections.

17. A hermetically packaged electronic system comprising:
- a package base comprising a nonconductive substrate having a component-supporting surface;
- a plurality of electronic components disposed on said components-supporting surface;
- a seal ring disposed on said component-supporting surface encircling said electronic components;
- a set of inner contact points on said component-supporting surface and a corresponding set of outer contact points on said component-supporting surface, said inner contact points being encircled by said seal ring and said outer contact points being situated outside said seal ring;
- a set of electrical conductors buried at least in part in said substrate and extending between said inner and outer sets of contact points;
- a multilayer interconnect structure including interleaved layers of dielectric material and conductive material, said multilayer interconnect structure being disposed over said components, over portions of said substrate, and over said inner set of contact points; and a package lid hermetically attached to said seal ring and enclosing said electronic components and said multilayer interconnect structure.

18. The hermetically packaged electronic system in accordance with claim 17 and further comprising an electrical feedthrough extending from said seal ring through said substrate to a surface opposite said component-supporting surface, said feedthrough allowing said seal ring and said package lid to be grounded therethrough.

19. The hermetically packaged electronic system in accordance with claim 17 and further including a lead frame, at least some of said outer contact points being connected to corresponding individual leads of said lead frame.

20. The hermetically packaged electronic system in accordance with claim 17, wherein
said component-supporting surface includes at least one cavity, said electronic components being disposed in said cavity such that major surfaces of said electronic components are substantially coplanar with a portion of said component-supporting surface surrounding said cavity; and wherein
said seal ring comprises a solder seal ring on said portion of said component-supporting surface surrounding said cavity.

21. The hermetically packaged electronic system in accordance with claim 17, wherein
said component-supporting surface includes at least one cavity, said electronic components being disposed in said cavity such that major surfaces of said electronic components are substantially coplanar with a portion of said component-supporting surface surrounding said cavity and said component-supporting surface further includes a peripheral ledge having a ledge surface recessed with respect to said portion of said component-supporting surface surrounding said cavity; and wherein
said seal ring comprises a weldable ring disposed on said ledge surface, said weldable ring having a thickness such that a major surface thereof is substantially coplanar with said portion of said component-supporting surface surrounding said cavity.

* * * * *